(12) United States Patent
Cho et al.

(10) Patent No.: US 8,138,090 B2
(45) Date of Patent: Mar. 20, 2012

(54) METHOD FOR FORMING FINE PATTERNS IN SEMICONDUCTOR DEVICE

(75) Inventors: Sung-Yoon Cho, Kyoungki-do (KR); Chang-Goo Lee, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 1115 days.

(21) Appl. No.: 12/005,463

(22) Filed: Dec. 26, 2007

(65) Prior Publication Data

US 2008/0233750 A1 Sep. 25, 2008

(30) Foreign Application Priority Data

Mar. 19, 2007 (KR) .................. 10-2007-0026541

(51) Int. Cl.
*H01L 21/302* (2006.01)

(52) U.S. Cl. ........ 438/692; 438/735; 438/736; 438/739; 438/942; 216/46; 216/88; 257/E21.233

(58) Field of Classification Search ................. None
See application file for complete search history.

(56) References Cited

U.S. PATENT DOCUMENTS

| | | | | |
|---|---|---|---|---|
| 5,369,061 A | * | 11/1994 | Nagayama | 438/696 |
| 5,444,005 A | * | 8/1995 | Kim et al. | 438/396 |
| 5,618,383 A | * | 4/1997 | Randall | 430/314 |
| 5,710,066 A | * | 1/1998 | Okamoto et al. | 216/46 |
| 5,942,787 A | * | 8/1999 | Gardner et al. | 257/408 |
| 6,525,371 B2 | * | 2/2003 | Johnson et al. | 257/317 |
| 2001/0024883 A1 | * | 9/2001 | Huang et al. | 438/695 |
| 2008/0157194 A1 | * | 7/2008 | Lee et al. | 257/334 |

FOREIGN PATENT DOCUMENTS

| | | |
|---|---|---|
| CN | 1885492 | 12/2006 |
| CN | 1892993 | 1/2007 |
| JP | 05-003181 | 1/1993 |
| JP | 05-088375 | 4/1993 |
| KR | 1997-0052556 | 7/1997 |
| KR | 2003-0009631 A | 2/2003 |
| KR | 2003-0049166 | 6/2003 |
| KR | 10-0672123 B1 | 1/2007 |
| TW | 451291 | 8/2001 |
| TW | 200509213 | 8/2001 |
| TW | 200620408 | 6/2006 |

\* cited by examiner

*Primary Examiner* — Anita Alanko

(74) *Attorney, Agent, or Firm* — Blakely, Sokoloff, Taylor & Zafman

(57) ABSTRACT

A method for forming fine patterns in a semiconductor device includes forming a first hard mask layer over an etch target layer, forming first etch mask patterns having negative slopes over the first hard mask layer, thereby forming a resultant structure, forming a first material layer for a second etch mask over the resultant structure, performing a planarization process until the first etch mask patterns are exposed to form second etch mask patterns filled in spaces between the spacers, removing the spacers, and etching the first hard mask layer and the etch target layer using the first etch mask patterns and the second etch mask patterns.

18 Claims, 7 Drawing Sheets

METHOD FOR FORMING FINE PATTERNS IN SEMICONDUCTOR DEVICE

CROSS-REFERENCE TO RELATED APPLICATIONS

The present invention claims priority of Korean patent application number 2007-0026541, filed on March 19, which is incorporated by reference in its entirety.

BACKGROUND OF THE INVENTION

The present invention relates to a method for fabricating a semiconductor device, and more particularly, to a method for fabricating fine patterns in a semiconductor device.

As semiconductor devices are highly integrated, fine patterns become necessary. However, a photolithography apparatus has a limitation to form fine space (line and space) patterns.

Recently, a double patterning method has been suggested to form patterns by using two photo masks. The double patterning method easily forms fine line and space patterns under 60 nm using a widely used photolithography apparatus. A detailed description follows referring to FIGS. 1A to 1C.

FIGS. 1A to 1C are cross-sectional views of a typical method for forming fine patterns in a semiconductor.

Referring to FIGS. 1A, a first photoresist layer PR1 is coated over an etch target layer 10. The first photoresist layer PR1 is patterned using a photo-exposure and a development process. The etch target layer 10 is etched using the patterned first photoresist layer PR1 as a mask.

Referring to FIG. 1B, after removing the patterned first photoresist layer PR1, a second photoresist layer PR2 is coated over a resultant structure and the second photoresist layer PR2 is patterned using a photo-exposure and a development process. An opening of the patterned second photoresist layer PR2 is not overlapped with that of the patterned first photoresist layer PR1.

Referring to FIG. 1C, the etch target layer 10 is re-etched using the patterned second photoresist layer PR2 as a mask. Thus, fine patterns having a narrow line and space width are formed.

However, even though the double patterning method is used, patterns having a line and space width under 30 nm are difficult to form. This result occurs because the typical method using two photo masks cannot form a line and space width under 30 nm. Further, using more than two photo masks makes it difficult to control the accuracy of an overlay during the photo-exposure process.

Thus, techniques to produce ultra fine patterns, e.g. ultra fine patterns under 20 nm, are required as semiconductor devices become highly integrated.

SUMMARY OF THE INVENTION

Embodiments of the present invention are directed to provide a method for forming fine patterns in a semiconductor device. The method overcomes a limitation of an apparatus during a photolithography process, improves a typical double patterning method, and makes it is possible to form ultra fine patterns in a semiconductor device.

In accordance with an aspect of the present invention, there is provided a method for forming fine patterns in a semiconductor device. The method includes forming a first hard mask layer over an etch target layer, forming first etch mask patterns having negative slopes over the first hard mask layer, thereby forming a resultant structure, forming a first material layer for a second etch mask over the resultant structure, performing a planarization process until the first etch mask patterns are exposed to form second etch mask patterns filled in spaces between the spacers, removing the spacers, and etching the first hard mask layer and the etch target layer using the first etch mask patterns and the second etch mask patterns.

DESCRIPTION OF SPECIFIC EMBODIMENTS

Embodiments of the present invention relate to a method for forming fine patterns in a semiconductor device.

FIGS. 2A to 2L are cross-sectional views of a method for forming fine patterns in a semiconductor device in accordance with an embodiment of the present invention.

Figure 1A:
FIG. 1A is a cross-sectional view illustrating an initial step in a typical method for forming fine patterns in a semiconductor device.
Figure 1B:
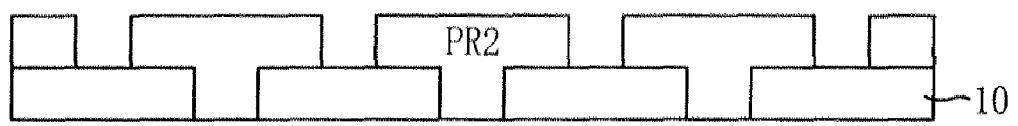
FIG. 1B is a cross-sectional view illustrating a subsequent step following FIG. 1A.
Figure 1C:
FIG. 1C is a cross-sectional view illustrating a subsequent step following FIG. 1B.
Figure 2A:
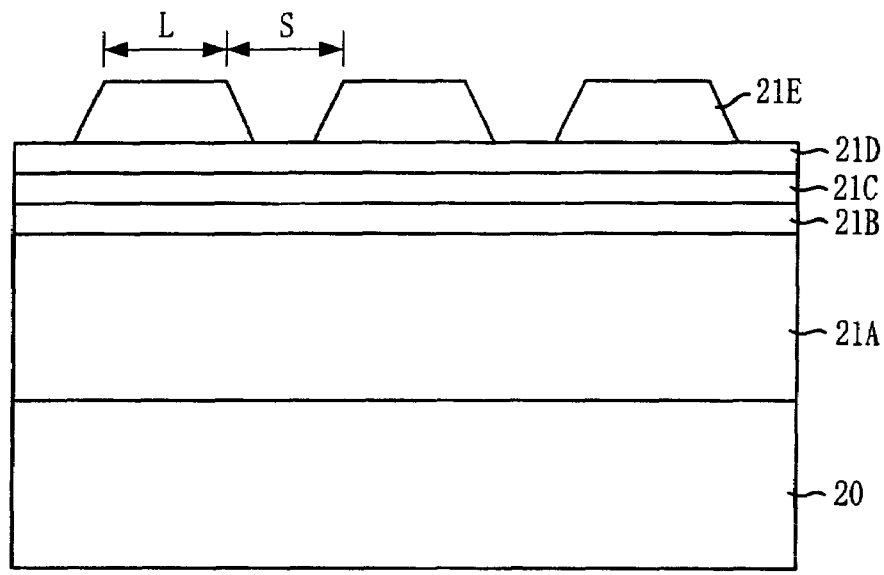
FIG. 2A is a cross-sectional view illustrating an initial step in a method for forming fine patterns in a semiconductor device in accordance with an embodiment of the present invention.

Referring to FIG. 2A, a hard mask layer is formed over an etch target layer 20. The hard mask layer has a stack structure. For instance, an amorphous carbon layer 21A, a first silicon oxy-nitride (SiON) layer 21B, and an aluminum oxide ($Al_2O_3$) layer 21E are sequentially stacked. Also, the hard mask layer may include a polysilicon layer 21C and a second SiON layer 21D below the $Al_2O_3$ layer 21E. When the hard mask layer includes a single SiON layer, i.e., when the hard mask layer does not include the polysilicon layer 21C and the second SiON layer 21D, the first SiON layer 21B has a thickness more than approximately 700 Å. However, when a multi-layered SiON layer is used like in this embodiment, i.e., when the polysilicon layer 21C and the second SiON layer 21D are formed below the $Al_2O_3$ layer 21E, the second SiON layer 21D has a thickness not more than approximately 700 Å.

Then, a typical double patterning method is used to pattern the Al.sub.20.sub.3 layer 21E, and thus fine $Al_2O_3$ patterns, e.g., the $Al_2O_3$ patterns 21E having a line and space line width under 35 nm, are formed.

The $Al_2O_3$ patterns 21E have positive slopes. Accordingly, a space width S of the $Al_2O_3$ patterns 21E decreases as the pattern goes down. Finally, the final space width S can be under 20 nm at the end of the slope. Since the $Al_2O_3$ patterns 21E have positive slopes, the subsequent first etch mask patterns have negative slopes, thereby decreasing linewidth of the patterns formed by the first etch mask patterns.

Figure 2B:
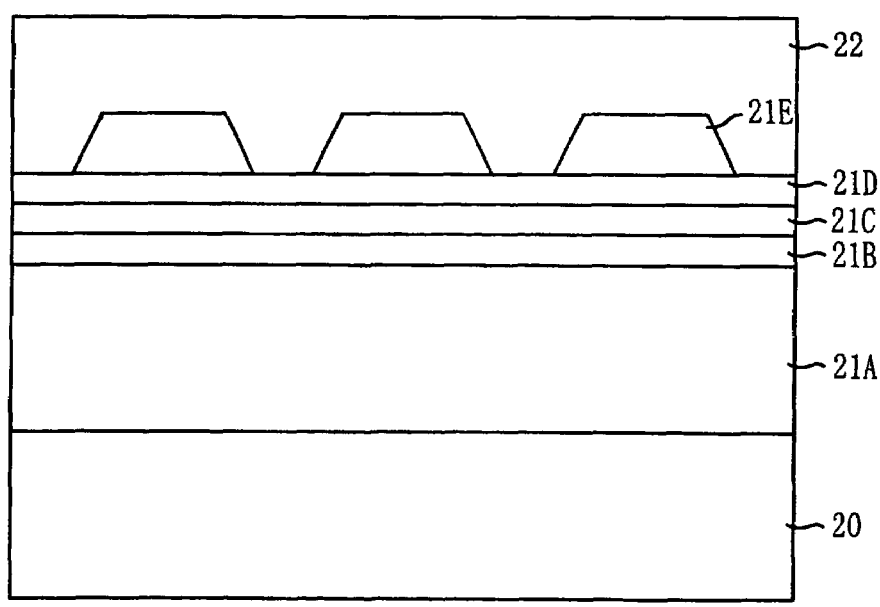
FIG. 2B is a cross-sectional view illustrating a subsequent step following FIG. 2A.

Referring to FIG. 2B, a first material layer 22 for the subsequent first etch mask patterns is formed over a resultant structure including the $Al_2O_3$ patterns 21E. The first material layer 22 includes a high density plasma (HDP) oxide layer.

Figure 2C:
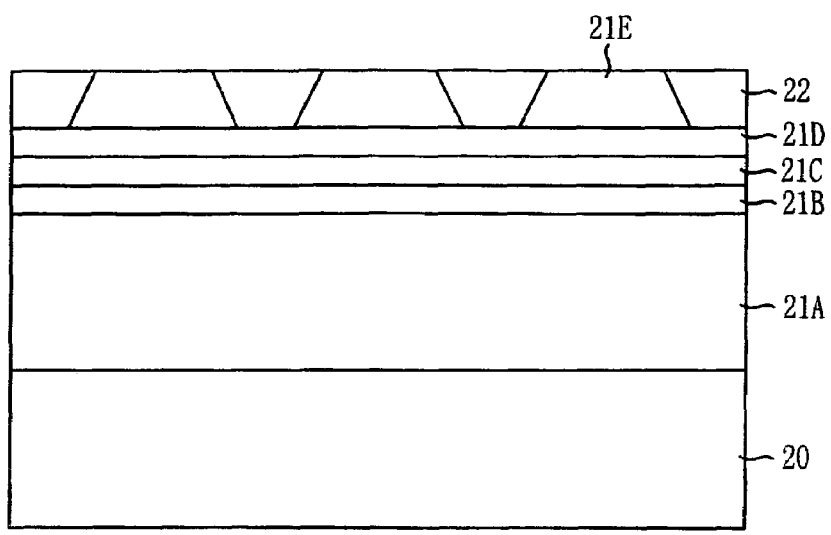
FIG. 2C is a cross-sectional view illustrating a subsequent step following FIG. 2B.

Referring to FIG. 2C, a planarization process, e.g., a chemical mechanical polishing (CMP) process, is performed on the first material layer 22 until a surface of the $Al_2O_3$ patterns 21E are exposed. Thus, the first material layer 22 is filled in spaces between the $Al_2O_3$ patterns 21E, thereby forming first etch mask patterns 22A.

Figure 2D:
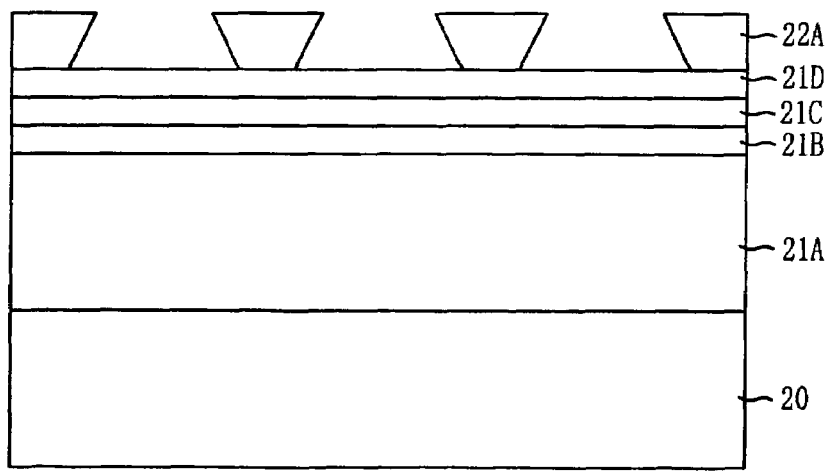
FIG. 2D is a cross-sectional view illustrating a subsequent step following FIG. 2C.

Referring to FIG. 2D, the $Al_2O_3$ patterns 21E are removed by a wet or a dry-etch removal process. Thus, the first etch mask patterns 22A remain over the second SiON layer 21D. The first etch mask patterns 22A have negative slopes.

Figure 2E:
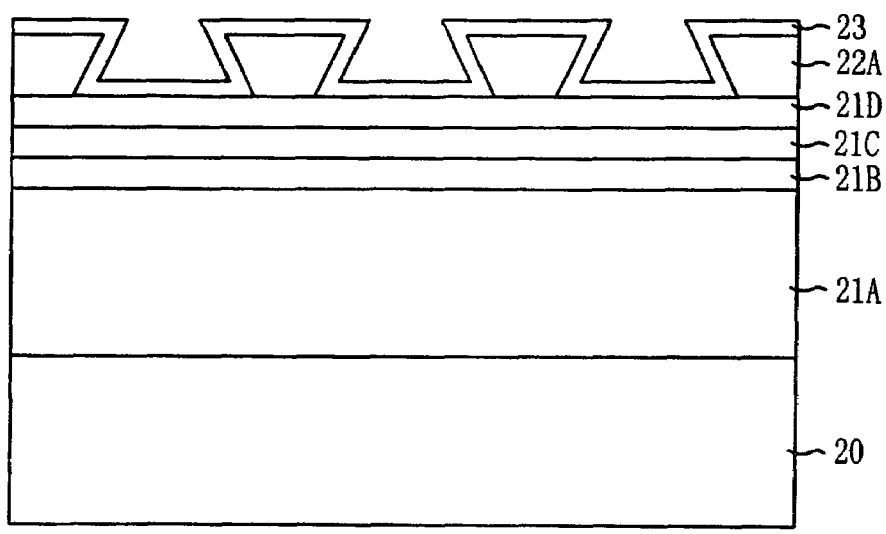
FIG. 2E is a cross-sectional view illustrating a subsequent step following FIG. 2D.

Referring to FIG. 2E, a second material layer 23 for spacers is deposited on a surface of a resultant structure including the first etch mask patterns 22A. The second material layer 23 includes a nitride layer.

Figure 2F:
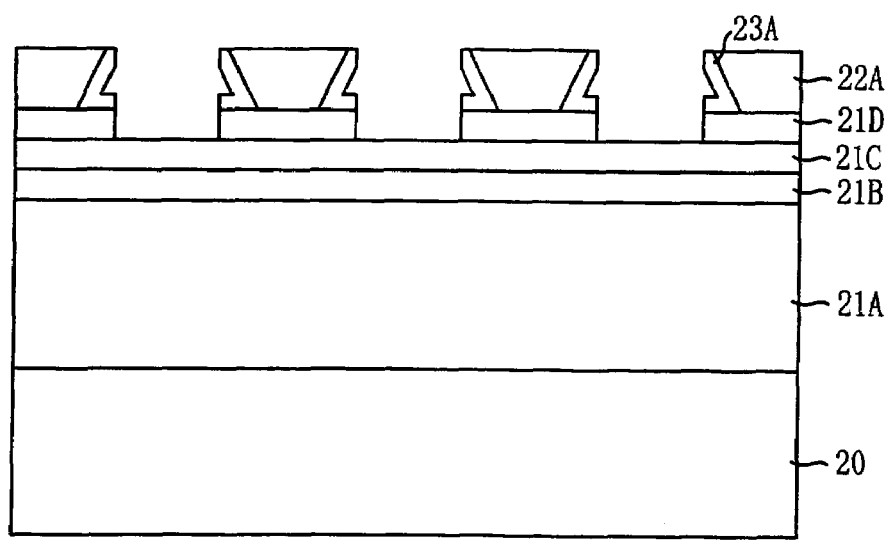
FIG. 2F is a cross-sectional view illustrating a subsequent step following FIG. 2E.

Referring to FIG. 2F, the second material layer 23 is spacer-etched to form spacers 23A on both sidewalls of the first etch mask patterns 22A. Generally, spacers formed by the spacer-etch process have positive slopes. However, in this embodiment, the spacers 23A have less positive slopes, because the first etch mask patterns 22A have negative slopes. When the second material layer 23 including the nitride layer is etched, the second SiON layer 21D thereunder may be etched together.

Figure 2G:
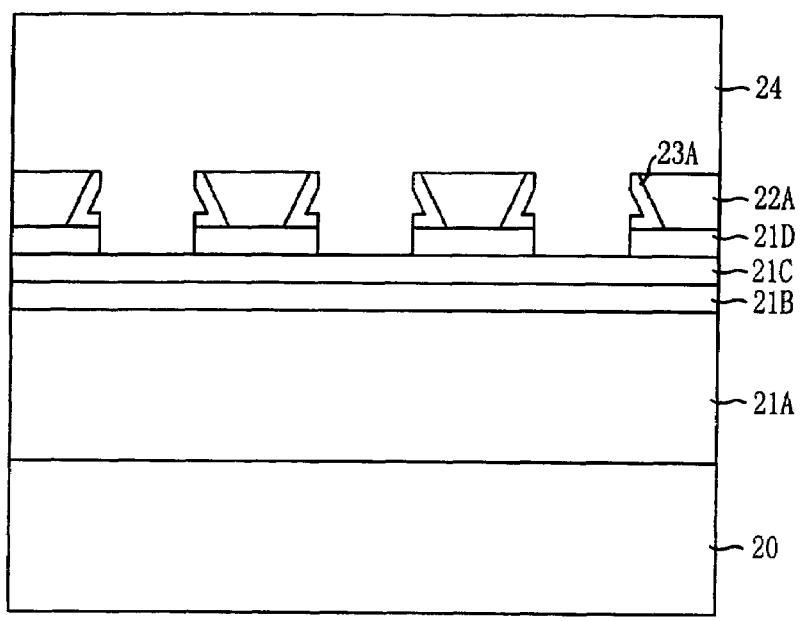
FIG. 2G is a cross-sectional view illustrating a subsequent step following FIG. 2F.

Referring to FIG. 2G, a third material layer 24 for forming the subsequent second etch mask patterns is formed over a resultant structure including the first etch mask patterns 22A and the spacers 23A formed on both sidewalls of the first etch mask patterns 22A. The material layer 24 includes the HDP oxide layer.

Figure 2H:
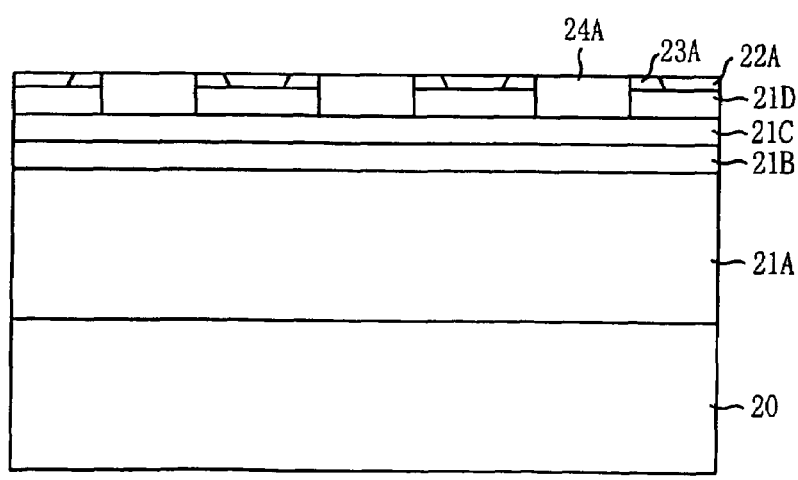
FIG. 2H is a cross-sectional view illustrating a subsequent step following FIG. 2G.

Referring to FIG. 2H, a planarization process, e.g., a CMP process, is performed on the third material layer 24, the first etch mask patterns 22A, and the spacers 23A until the first etch mask patterns 22A are exposed and remain with a certain thickness. Thus, the third material layer 24 is filled in spaces between the planarized spacers 23A, thereby forming second etch mask patterns 24A.

Figure 2I:
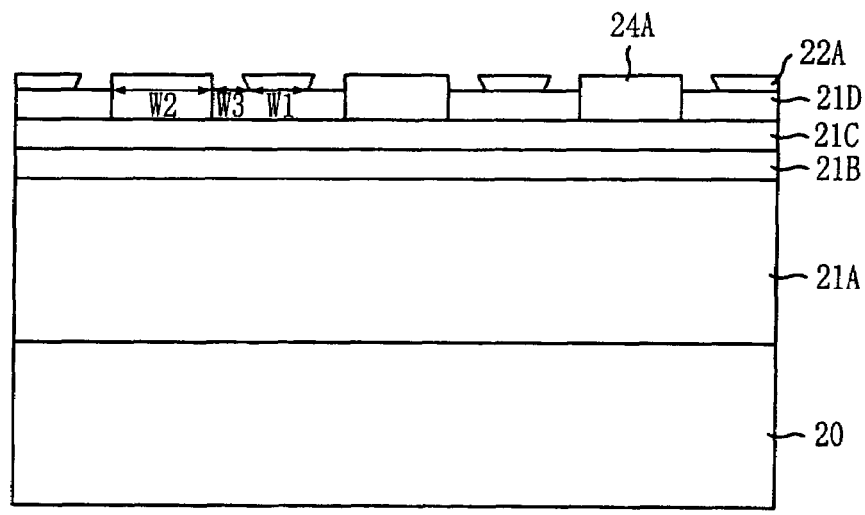
FIG. 2I is a cross-sectional view illustrating a subsequent step following FIG. 2H.

Referring to FIG. 2I, the planarized spacers 23A are removed by a wet-dip process. Thus, the first etch mask patterns 22A and the second etch mask patterns 24A which are separated as much as a lower width w3 of the spacers 23A remain over the resultant structure. A lower width w1 of the first etch mask patterns 22A and a width w2 of the second etch mask patterns 24A which results in a width under 20 nm. Thus, the underlying layers are etched using the first and the second etch mask patterns 22A and 24A to form ultra fine patterns having a width under 20 nm. It is preferable to adjust the lower width w3 of the spacers 23A to make the width w1 of the first etch mask patterns 22A substantially the same as the second width w2 of the second mask patterns 24A.

Figure 2J:
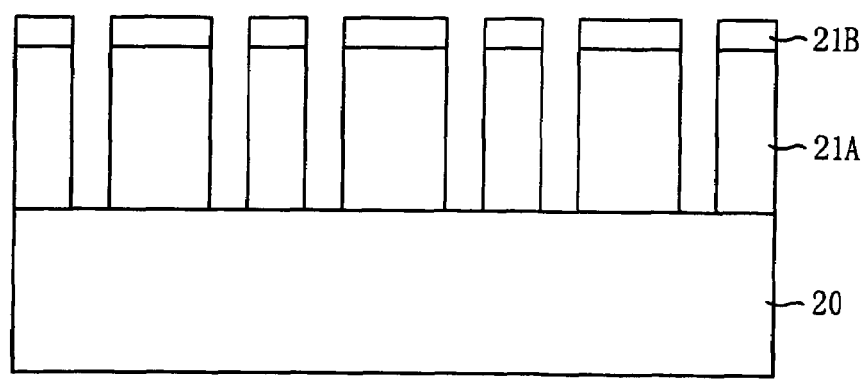
FIG. 2J is a cross-sectional view illustrating a subsequent step following FIG. 2I.

Referring to FIG. 2J, the second SiON layer 21D, the polysilicon layer 21C, the first SiON layer 21B, and the amorphous carbon layer 21A are sequentially etched using the first etch mask pattern 22A and the second etch mask patterns 24A as a mask and then the first etch mask pattern 22A, the second etch mask pattern 24A, the second SiON layer 21D, and the polysilicon layer 21C are removed.

Figure 2K:
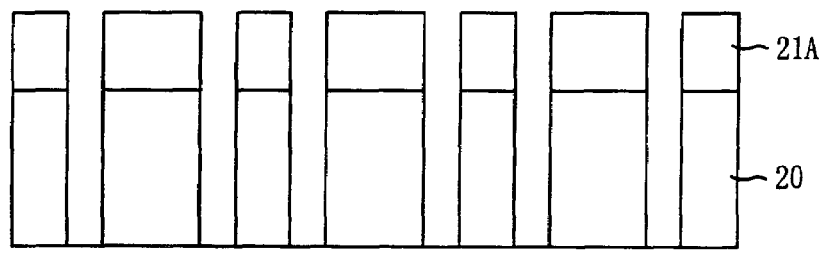
FIG. 2K is a cross-sectional view illustrating a subsequent step following FIG. 2J.

Referring to FIG. 2K, the etch target layer 20 is etched using the first SiON layer 21B and the amorphous carbon layer 21A as a mask. When the etch target layer 20 includes a nitride-based material, the first SiON layer 21B may be removed during the etch process of the etch target layer 20.

Figure 2L:
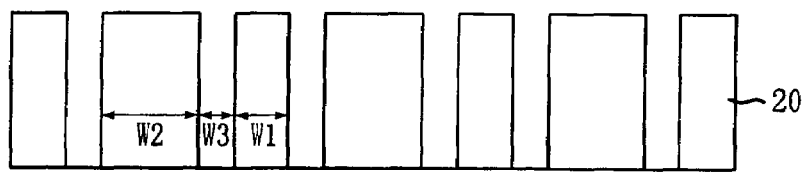
FIG. 2L is a cross-sectional view illustrating a subsequent step following FIG. 2K.

Referring to FIG. 2L, the remaining amorphous carbon layer 21A is removed. Thus, the etched etch target layer 20 includes ultra fine patterns having line width corresponding to the lower width w1 of the first etch mask patterns 22A and the width w2 of the second mask patterns 24A. The ultra fine patterns also have space width corresponding to the lower width w3 of the spacers 23A. For instance, the line and space width of the etch target patterns 20 may be under 20 nm. As described above, when the lower width w1 of the first etch mask patterns 22A is substantially the same as the width w2 of the second etch mask patterns 24A, the line width of the etch target patterns 20 may be kept constant.

The method for forming fine patterns of the present invention overcomes a limitation of a photolithography apparatus and improves a typical double patterning method, thereby forming ultra fine patterns.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for forming patterns in a semiconductor device, the method comprising:
    forming a first hard mask layer over an etch target layer;
    forming first etch mask patterns having negative slopes over the first hard mask layer;
    forming spacers on sidewalls of the first etch mask patterns, thereby forming a first resultant structure;
    forming a first material layer over the first resultant structure, thereby forming a second resultant structure;
    performing a planarization process on the second resultant structure until the first etch mask patterns are exposed, thereby forming second etch mask patterns filled in spaces between the spacers;
    removing the spacers; and
    etching the first hard mask layer and the etch target layer using the first etch mask patterns and the second etch mask patterns as etch masks.

2. The method of claim 1, wherein forming the first etch mask patterns comprises:
    forming a second hard mask layer over the first hard mask layer;
    patterning the second hard mask layer to form hard mask patterns having positive slopes, thereby forming a third resultant structure;
    forming a second material layer for the first etch mask patterns over the third resultant structure including the hard mask patterns;
    planarizing the second material layer until the hard mask patterns are exposed; and
    removing the hard mask patterns.

3. The method of claim 2, wherein the second hard mask layer includes an aluminum oxide ($Al_2O_3$) layer.

4. The method of claim 2, wherein patterning the second hard mask layer is performed using a double patterning method.

5. The method of claim 4, wherein the hard mask patterns have line and space widths of approximately 35 nm and the first etch mask patterns have lower widths under approximately 20 nm.

6. The method of claim 1, wherein the first hard mask layer has a stack structure of an amorphous carbon layer and a silicon oxy-nitride (SiON) layer.

7. The method of claim 6, wherein the SiON layer has a thickness of more than approximately 700 Å.

8. The method of claim 1, wherein the first hard mask layer has a stack structure of an amorphous carbon layer, a first SiON layer, a polysilicon layer, and a second SiON layer.

9. The method of claim 8, wherein the second SiON layer has a thickness equal to or less than approximately 700 Å.

10. The method of claim 1, wherein the first etch mask patterns or the second etch mask patterns include a high density plasma (HDP) oxide layer.

11. The method of claim 2, wherein removing the hard mask patterns is performed by a wet or a dry-etch process.

12. The method of claim 1, wherein forming the spacers comprises:
depositing a nitride layer along a surface of a fourth resultant structure including the first etch mask patterns; and
performing a spacer-etch process on the nitride layer.

13. The method of claim 1, wherein removing the spacers is performed using a wet-dip method.

14. The method of claim 1, wherein performing the planarization process comprises using a chemical mechanical polishing (CMP) process.

15. The method of claim 2, wherein the planarization process is a CMP process.

16. The method of claim 1, wherein a width of the first etch mask patterns is substantially the same as a width of the second etch mask patterns.

17. A method for forming patterns in a semiconductor device, the method comprising:
forming a first hard mask layer over an etch target layer;
forming first etch mask patterns having negative slopes over the first hard mask layer;
forming spacers on sidewalls of the first etch mask patterns;
forming a first material layer covering the resultant structure including the spacers;
performing a planarization process on the first material layer until the first etch mask patterns are exposed thereby forming second etch mask patterns;
removing the spacers;
etching portions of the first hard mask layer using the first etch mask patterns and the second etch mask patterns as etch masks;
removing the first etch mask patterns and the second etch mask patterns;
etching the etch target layer using the first hard mask layer as a mask; and
removing the first hard mask layer.

18. A method for forming patterns in a semiconductor device, the method comprising:
forming a first hard mask layer over an etch target layer;
patterning a portion of the first hard mask layer so that the resulting patterns have positive slopes;
forming a first material layer over a resultant structure including the resulting patterns;
performing a planarization process on the first material layer until a surface of the resulting patterns are exposed thereby forming first etch mask patterns having negative slopes;
depositing a second material layer on a surface of a second resultant structure including the first etch mask patterns;
forming spacers on sidewalls of the first etch mask patterns;
forming a third material layer over a third resultant structure including the first etch mask patterns and the spacers;
performing a planarization process on the third material layer, the first etch mask patterns, and the spacers until the first etch mask patterns are exposed and remain with a predetermined thickness thereby forming second etch mask patterns;
sequentially etching portions of the first hard mask layer using the first etch mask pattern and the second etch mask pattern as a mask;
removing the first etch mask pattern and the second etch mask pattern;
etching the etch target layer using the first hard mask layer as a mask; and
removing the remaining portions of the first hard mask layer.

* * * * *